(12) United States Patent
Sugane

(10) Patent No.: US 7,956,292 B2
(45) Date of Patent: Jun. 7, 2011

(54) PRINTED CIRCUIT BOARD MANUFACTURING METHOD, PRINTED CIRCUIT BOARD, AND ELECTRONIC APPARATUS

(75) Inventor: Mitsuhiko Sugane, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 268 days.

(21) Appl. No.: 11/955,697

(22) Filed: Dec. 13, 2007

(65) Prior Publication Data

US 2008/0201945 A1 Aug. 28, 2008

(30) Foreign Application Priority Data

Feb. 28, 2007 (JP) ................................. 2007-050023

(51) Int. Cl.
*H05K 1/11* (2006.01)
(52) U.S. Cl. ........ 174/262; 174/255; 174/260; 174/265; 174/266; 29/852; 29/25.35; 29/890.1; 438/197; 438/679
(58) Field of Classification Search .................. 174/262, 174/260, 265, 266, 255; 29/852, 25.35, 890.1; 438/197, 679
See application file for complete search history.

(56) References Cited

U.S. PATENT DOCUMENTS

| | | | | |
|---|---|---|---|---|
| 5,206,052 A | * | 4/1993 | Nakaso et al. ................. | 427/97.2 |
| 5,480,675 A | * | 1/1996 | Murakami et al. ............. | 427/97.7 |
| 5,499,446 A | * | 3/1996 | Murakami ....................... | 29/852 |
| 5,953,629 A | * | 9/1999 | Imazeki et al. ................ | 438/679 |
| 6,120,670 A | * | 9/2000 | Nakajima ....................... | 205/125 |
| 6,331,248 B1 | * | 12/2001 | Taniguchi et al. ........... | 210/321.8 |
| 6,339,197 B1 | * | 1/2002 | Fushie et al. ................... | 174/262 |
| 7,183,650 B2 | * | 2/2007 | Shiono et al. .................. | 257/758 |
| 7,193,329 B2 | * | 3/2007 | Takahashi ....................... | 257/781 |
| 7,404,908 B2 | * | 7/2008 | Yamaoka ......................... | 216/18 |
| 7,434,311 B2 | * | 10/2008 | Koizumi .......................... | 29/852 |
| 7,557,445 B2 | * | 7/2009 | Choi et al. ...................... | 257/748 |
| 2002/0100608 A1 | * | 8/2002 | Fushie et al. ................... | 174/255 |
| 2003/0121699 A1 | | 7/2003 | Happoya | |
| 2006/0268074 A1 | * | 11/2006 | Hori .................................. | 347/68 |
| 2007/0052067 A1 | * | 3/2007 | Umemoto ....................... | 257/587 |
| 2009/0117336 A1 | * | 5/2009 | Usui et al. ....................... | 428/172 |

FOREIGN PATENT DOCUMENTS

| | | |
|---|---|---|
| JP | 02143588 A | 6/1990 |
| JP | 2003204157 A | 7/2003 |

* cited by examiner

*Primary Examiner* — Xiaoliang Chen
(74) *Attorney, Agent, or Firm* — Fujitsu Patent Center

(57) ABSTRACT

A printed circuit board manufacturing method includes: a hole-forming step of forming a through hole in a substrate that will become an element of a printed circuit board after manufacturing; and a jig insertion step of inserting a jig in the through hole formed in the hole-forming step such that the jig adheres to a portion of an inner wall of the through hole, the inner wall having a portion connecting to the outside of the through hole. The method further includes a conductive-film forming step of forming a conductive film only on the portion of the inner wall of the through hole connecting to the outside of the through hole, after the jig is inserted into the through hole in the jig insertion step.

2 Claims, 8 Drawing Sheets

PRINTED CIRCUIT BOARD MANUFACTURING METHOD, PRINTED CIRCUIT BOARD, AND ELECTRONIC APPARATUS

BACKGROUND OF THE INVENTION

1. Field of the Invention

The present invention relates to a printed circuit board manufacturing method having in particular a characteristic in the through-hole formation, a printed circuit board manufactured by the manufacturing method, and an electronic apparatus equipped with such a printed circuit board.

2. Description of the Related Art

Fabrication of an electronic circuit by mounting electronic components on a printed circuit board is widely performed. The electronic circuit performs a required operation by means of wiring between circuits within the electronic components and signal lines on the printed circuit board.

On a printed circuit board, through holes are formed for the purpose of mounting electronic components or connecting wires formed on different layers of the printed circuit board, and a conductive film is formed on an inner wall of the through hole by a process such as plating to connect the wires in plural layers. Also, electronic components are connected to wires of the printed circuit board by soldering after leads of the electronic components are inserted into the through holes.

Here, in a case of connecting wires in plural layers and carrying a signal at high speed with a conductive film of the inner wall of the through holes, for the purpose of reducing the transfer loss caused by the conductive film of the through holes, the conductive film of the inner wall of the through holes is not formed over the entire span of the printed circuit board of the through holes from the surface to the underside, but is removed in unnecessary places and left behind on portions necessary for the connection of high-speed-transfer-use wires through a plurality of layers.

FIG. 1 shows the appearance of eliminating conductive film formed in the through holes of the printed circuit board. FIG. 2 shows the appearance of having eliminated a portion of the conductive film formed in the through holes of the printed circuit board. In the FIGS. 1 and 2, only one through hole 11 of a printed circuit board 10 is shown as an example.

Here, a conductive film 111 is formed on the inner wall of the through hole 11, and a wire 101 and a wire 102 in two levels, of among wires 101, 102, 103, 104 of 4 levels, are set into connection with the conductive film 111. At this time, first, the conductive film is once formed over the entire area, that is, the entire area from the surface of the printed circuit board 10 to the underside thereof, of the inner wall of the through hole 11, and after this, the conductive film 111 formed on the inner wall of the through hole 11 is removed with a drill 20 as shown in FIG. 1, thus leaving behind the conductive film 111 on the inner wall of the through hole 11 as shown in FIG. 2 only in a portion that connects the wires 101 and 102 in the two layers. In this case, there is formed a difference-in-level 112 between the portion of the inner wall of the through hole 11 treated by the drill, and the portion un-treated by the drill, even if the conductive film 111 is not considered. By doing this, it is possible, with the wires 101 and 102, to reduce transfer loss of the transferred high speed signal in the through holes 11.

However, in this method, the conductive layer is eliminated after it has been formed in the inner wall of the through holes. This increases the number of processes, thereby increasing costs, and there is also a concern that remnants resulted from insufficient elimination of the conductive film are very likely to cause a short-circuit between wires.

In Japanese Patent Application Publication No. 2003-204157, there is proposed a technique that, for the purpose of solving the above problem, buries a plating prevention layer in the printed circuit board to which a conductive film cannot adhere by plating or the like, and the conductive film is cut off at a portion of the inner wall of the through hole on which portion the plating prevention layer appears.

Also, in Japanese Patent Application Publication No. 1990-143588, there is proposed a technique that forms an intermediate single layer of an insulation plate in a bulky printed circuit board, the insulation plate being formed of a material that cannot be treated by plating, thereby preventing the conductive film from being formed at a portion of the inner wall of the through hole where this insulation plate appears.

However, in the technique proposed in the above mentioned Japanese Patent Application Publication No. 2003-204157, since the conductive film of the inner wall of the through hole is separated only by the end face of the thin plating prevention layer, electronic coupling occurs in cases of high speed signals and thus, it is very likely that transfer loss cannot be sufficiently reduced.

And in the technique proposed in the above mentioned Japanese Patent Application Publication No. 1990-143588, because the conductive film between the through holes is separated only by the insulation plate and thus, coupling is very likely to occur even in a case of a high speed signal, it is possible to reduce transfer loss. However, with this technique, since in any through hole, the conductive film on the inner wall is separated by the insulation plate, it is impossible to separate only the conductive film of the through hole connecting the wires handling high speed signal transfer. Therefore, this technique cannot be used in a case where through holes in which the conductive film of the inner wall should be separated and through holes in which the conductive film of the inner wall should not be separated are interspersed in a printed circuit board.

SUMMARY OF THE INVENTION

The present invention was conceived in light of the above problem to provide a printed circuit board manufacturing method that manufactures a printed circuit board in which a conductive film is formed in only a portion of the inner wall of a necessary through hole without requiring a later treatment, a printed circuit board manufactured by the manufacturing method, and an electronic apparatus equipped with the printed circuit board.

A printed circuit board manufacturing method according to the present invention includes:

a hole-forming step of forming a through hole in a substrate that will become an element of a printed circuit board after manufacturing;

a jig insertion step of inserting a jig in the through hole formed in the hole-forming step such that the jig adheres to a portion of the inner wall of the through hole, the inner wall having a portion connecting to the outside of the through hole; and a conductive-film forming step of forming a conductive film only on the portion of the inner wall of the through hole connecting to the outside of the through hole, after the jig is inserted into the through hole in the jig insertion step.

The printed circuit board manufacturing method of the present invention, after forming a through hole, forms a conductive film after inserting a jig into the hole to adhere to a portion of the inner wall of the hole, and thus it is possible to form a conductive film only on a portion of the inner wall of the through hole where the jig does not adhere to. Therefore, it is possible to omit a subsequent treatment such as drilling like the one mentioned above, as well as to omit use of special materials described in Japanese Patent Application Publications No. 2003-204157 and No. 1990-143588. Accordingly, it is possible to form a conductive film only to a portion of the inner wall of a necessary through hole.

Here, in the printed circuit board manufacturing method according to the present invention, the conductive-film forming step is a step of forming, by plating, an outer face of the substrate and the conductive film on the portion of the inner wall of the through hole connecting to the outside of the through hole.

Also, a printed circuit board according to the invention is a printed circuit board in which a through hole is formed wherein: at least on a portion of the printed circuit board which forms an inner wall of the through hole, a material that hinders the adherence of a conductive film is not used, and the conductive film is formed only on a portion of the inner wall of the through hole, and the portion of the inner wall of the through hole in which the conductive film is formed is flush with a portion of the inner wall of the through hole in which no conductive film is formed when the conductive film is not taken into account.

The printed circuit board of the present invention does not require use of materials that hinder the adherence of a conductive film to the inner wall of the through hole as proposed in Japanese Patent Application Publications No. 2003-204157 and No. 1990-143588. Also, in this printed circuit board of the present invention, no difference in level is formed on the inner wall of the through hole, which is inevitably formed due to drilling when the drilling is performed.

Here, in the printed circuit board according to the present invention, the conductive film formed on the inner wall of the through hole electrically connects signal transfer patterns of a plurality of layers.

Further, an electronic apparatus according to the present invention includes: the above-described printed circuit board; and electronic components mounted on the printed circuit board.

With the present invention described above, it is unnecessary to use subsequent treatments, and on top of that, it is possible to have formation of the conductive film only to portions of the inner wall of the through holes, to through holes that require it.

DETAILED DESCRIPTION OF THE INVENTION

Herein below, description will be given to embodiments of the present invention. First, features of the present invention will be described, and the entire manufacturing process of the printed circuit board will be described later.

Figure 1:
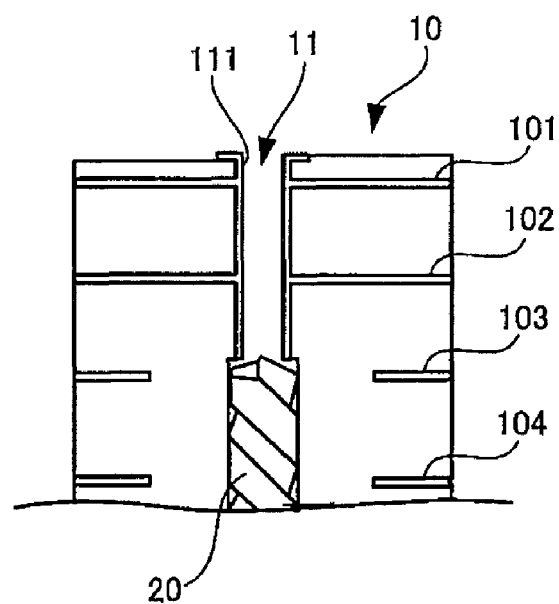
FIG. 1 shows a state in which elimination of a portion of a conductive film formed in a through hole of a printed circuit board is performed.
Figure 2:
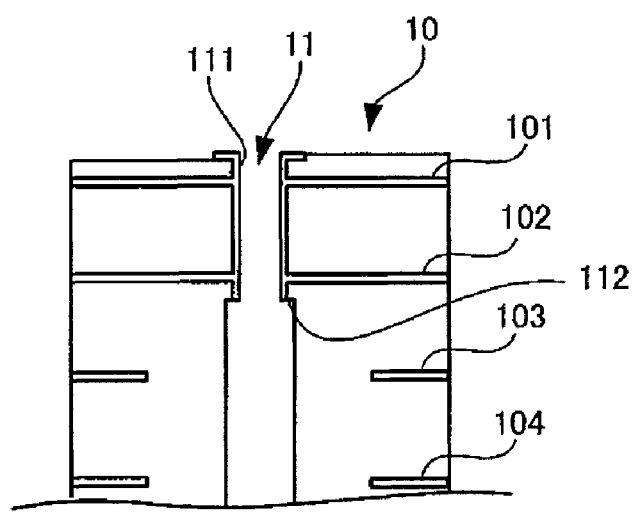
FIG. 2 shows a state in which the portion of the conductive film formed in the through hole of the printed circuit board has been eliminated.
Figure 3:
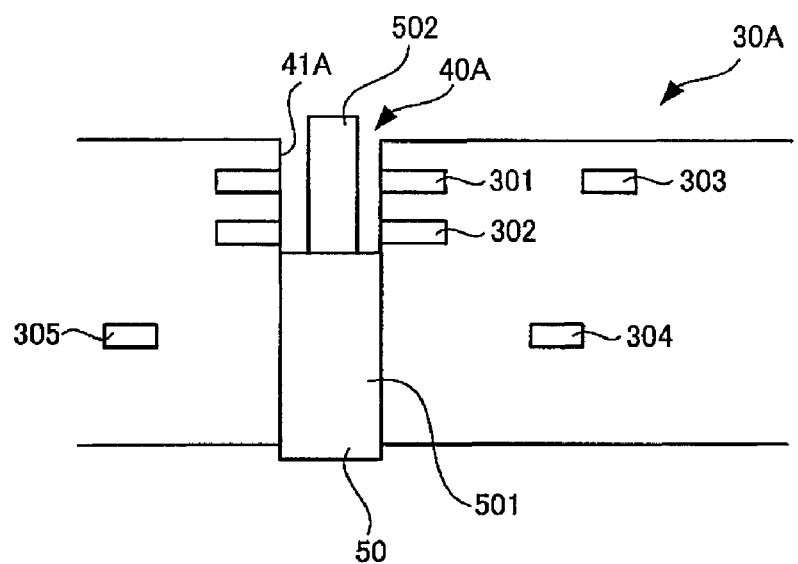
FIG. 3 shows a state in which a jig is inserted into a hole formed in a substrate.

FIG. 3 shows a state in which a jig is inserted into a hole formed in a substrate.

A substrate 30A shown in FIG. 3 is a substrate which will become a printed circuit board after being manufactured, and already formed within the substrate 30A are plural wires 301 to 305. Formed within this substrate 30A is a hole 40A which will serve as a through hole after manufacturing, and inserted into this hole 40A is a jig 50. This jig 50 has a large-diameter portion 501 that adheres to the inner wall of the hole 40A and a small-diameter portion 502 which is free of the inner wall. As shown in FIG. 3, the jig 50 is inserted such that the small-diameter portion 502 is located at a portion of the inner wall of the hole 40A at which portion the end faces of the two signal lines 301 and 302 appear, and the large-diameter portion 501 adheres to other portions of the inner wall.

Here, in the situation in which the jig 50 is inserted into the hole 40A, a conductive film of copper or the like is formed by plating only on a region of the inner wall of the hole 40A at which the small-diameter portion 502 of the jig 50 is present.

Figure 4:
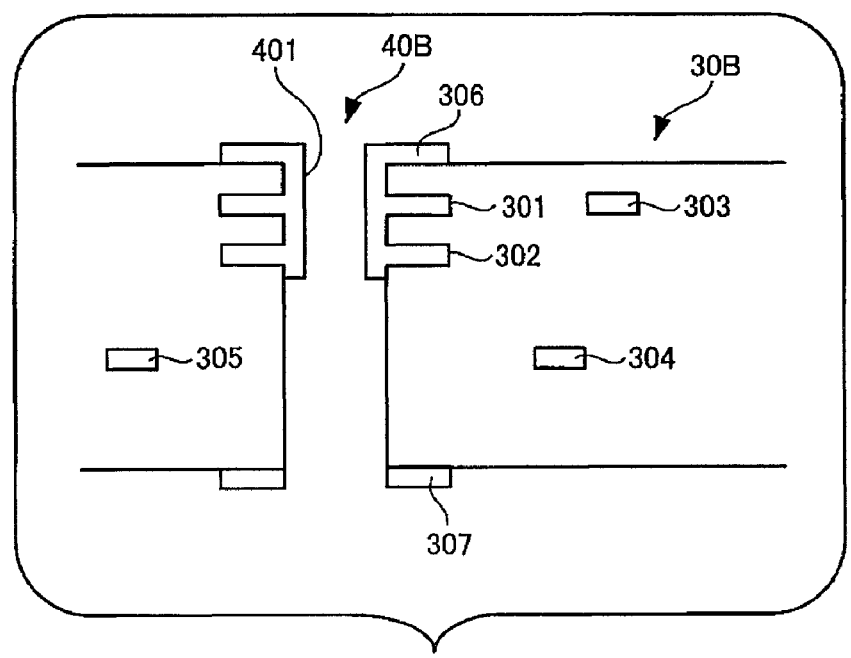
FIG. 4 shows a printed circuit board after being manufactured in a step of plating performed in a state in which the jig is inserted into the hole.

FIG. 4 shows a printed circuit board after being manufactured in a step of plating performed in a state in which the jig is inserted into the hole.

A printed circuit board 30B is a printed circuit board manufactured by plating performed in a state in which the jig 50 is inserted into the hole 40A as shown in FIG. 3, and a conductive film 401 is formed, not to the entire region of the inner wall of a through hole 40B from the surface to the underside, but only to a region connecting the two signal lines 301 and 302. And also, shown here is a state of the wires 306 and 307 formed on the surface and underside of the printed circuit board 30B by plating.

In the present embodiment, since the above-mentioned manufacturing method is used, if the conductive film 401 of the inner wall of the through hole is entirely ignored, an inner wall without a difference in level is formed aside from an increased diameter of a negligible amount that may occur due to the pressing of the jig against the inner wall in insertion.

Figure 5:
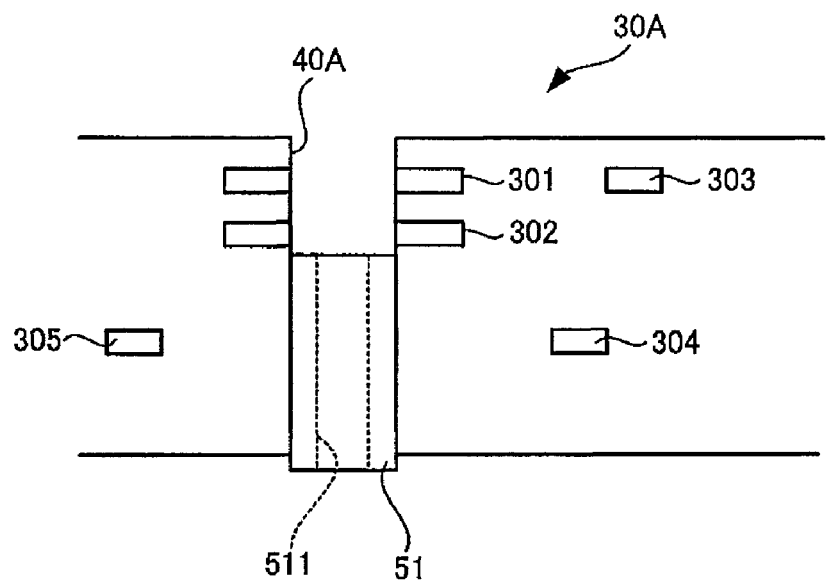
FIG. 5 shows a state in which a jig differing in form from the jig shown in FIG. 3 is inserted into a hole formed in a substrate.

FIG. 5 shows a state in which a jig differing in form from the jig shown in FIG. 3 is inserted into a hold formed in a substrate.

A substrate 30A in FIG. 5 is the same as the one shown in FIG. 3.

In FIG. 5, a hollow jig 51 in which a through hole 511 is formed is disposed so as to adhere to a region of the inner wall of a hole 40A in which the respective ends of the two signal lines 301 and 302 appear.

Here, since the hollow jig 51 is used, it is possible for plating fluid to flow through the hole 40A during plating and thus, the flow is improved, thereby making it possible to further reliably form a layer of conductive film on the inner wall of the hole 40A.

Figure 6:
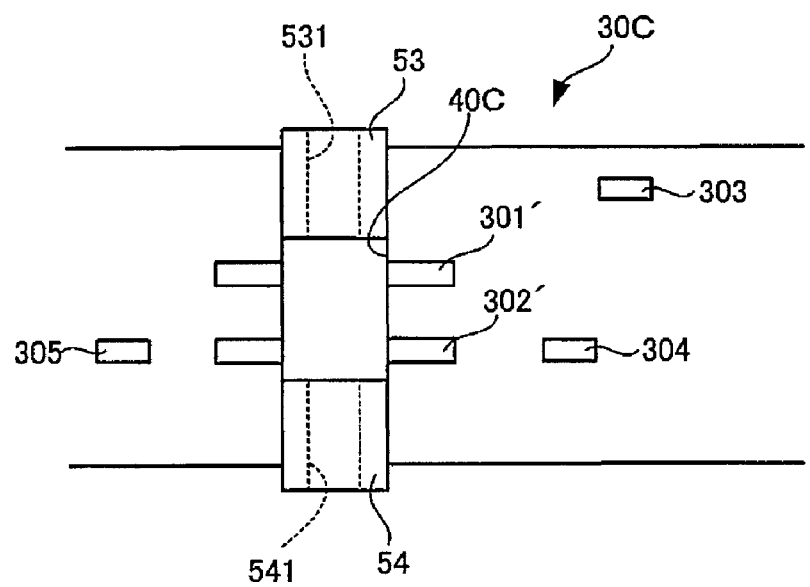
FIG. 6 shows another example of a state in which a jig is inserted into a hole formed in a substrate.
Figure 7:
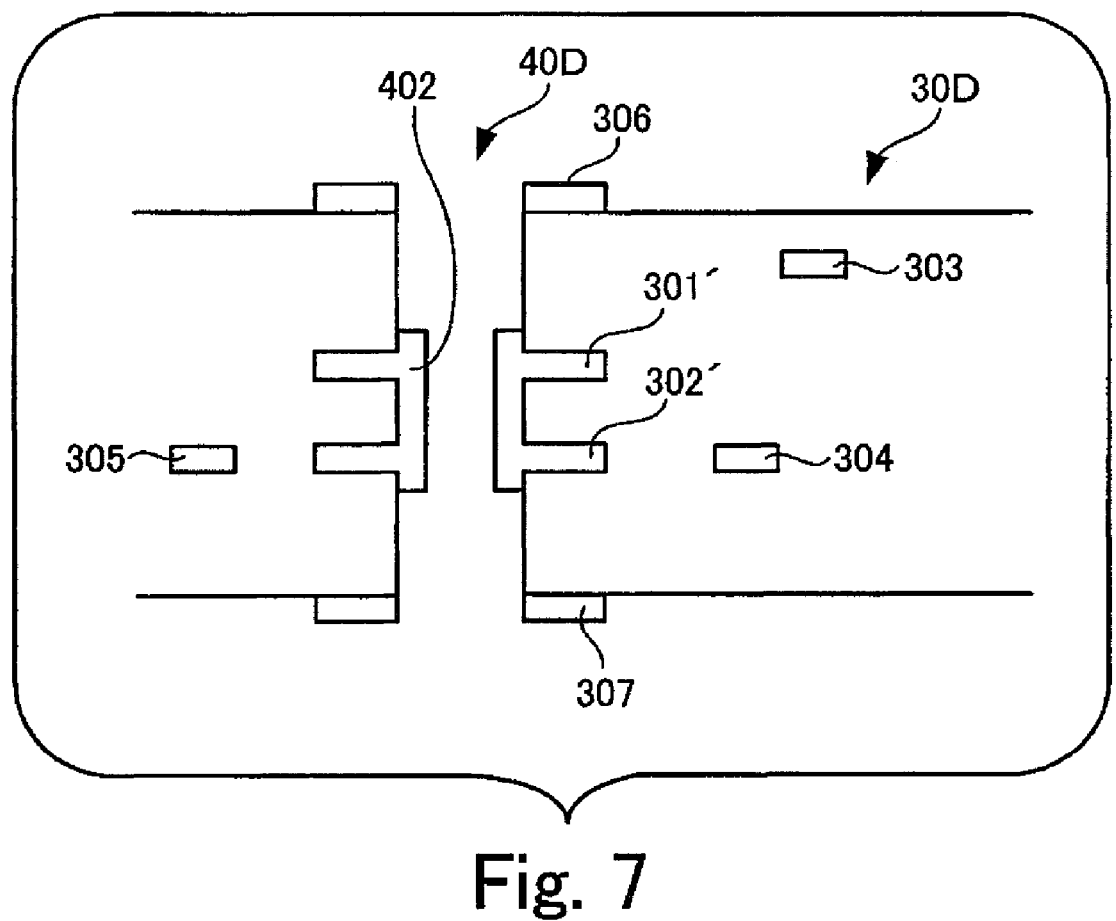
FIG. 7 shows a printed circuit board formed through a step of plating performed in the state shown in FIG. 6.

FIG. 6 shows another example of a state in which a jig is inserted into a hole formed in a substrate. FIG. 7 shows a printed circuit board formed through a step of plating performed in the state shown in FIG. 6.

In a substrate 30C shown in FIG. 6, a hole 40C is formed, and the end faces of the two signal lines 301' and 302' that are to be connected with a conductive film formed on the inner wall of the hole 40C appear in the central portion of the hole 40C. Because of this, two jigs 53 and 54 having through holes 531 and 541 respectively are inserted from both ends of the hole 40C and adhere to both sides of the hole 40C excluding the central portion at which the end faces of the two signal lines 301' and 302' appear. When plating is performed in such a state, as is shown in FIG. 7, a printed circuit board 30D in which a conductive film 402 is formed only at the central region of the inner face of a through hole 40D is formed.

Herein below, the manufacturing process of the printed circuit board will be summarized. Here, a jig having the form of the jig 50 of FIG. 3 is used.

Figure 8:
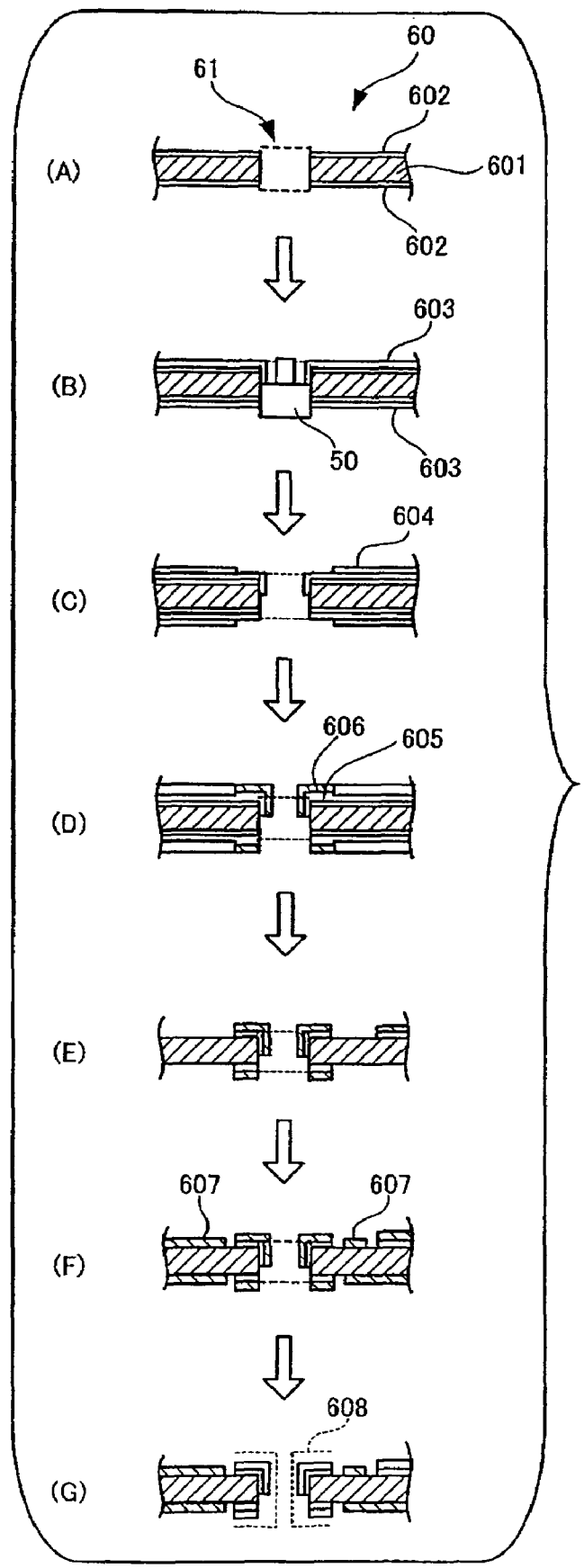
FIG. 8 shows a first example of the printed circuit board manufacturing method.

FIG. 8 shows a first example of the printed circuit board manufacturing method.

In FIG. 8 described here and FIGS. 9 to 11 described later, wiring in inner layers of the printed circuit board will is not shown and thus will not be described.

Here, first of all, as shown in part (A) of FIG. 8, a substrate 60 obtained by forming a copper layer 602 on the surface and the underside of a resin 601 is prepared, and then, a hole-forming treatment is carried out to form a hole 61 in the same substrate 60.

Next, as shown in part (B) of FIG. 8, the jig 50 is inserted into the hole 61 and a copper layer 603 is formed by plating.

Next, as shown in part (C) of FIG. 8, the jig 50 is removed and a plate resist film 604 is formed, and furthermore, as shown in part (D) of FIG. 8, a copper layer 605 and a solder layer 606 on the copper layer 605 are formed by plating on a region where the plate resist film 604 is not formed.

Next, as shown in part (E) of FIG. 8, the plating resist film 604 and the copper layer underneath the plating resist film 604 are removed by etching, and as shown in part (F) of FIG. 8, a resist film 607 is formed by printing. Moreover, as shown in part (G) of FIG. 8, an anti-tarnish treatment 608 is performed.

In this manner, by performing plating in a state in which the jig 50 is inserted in the plating step shown in part (B) of FIG. 8, a printed circuit board having a through hole in which a copper film is formed only on a part of the inner wall is manufactured.

Figure 9:
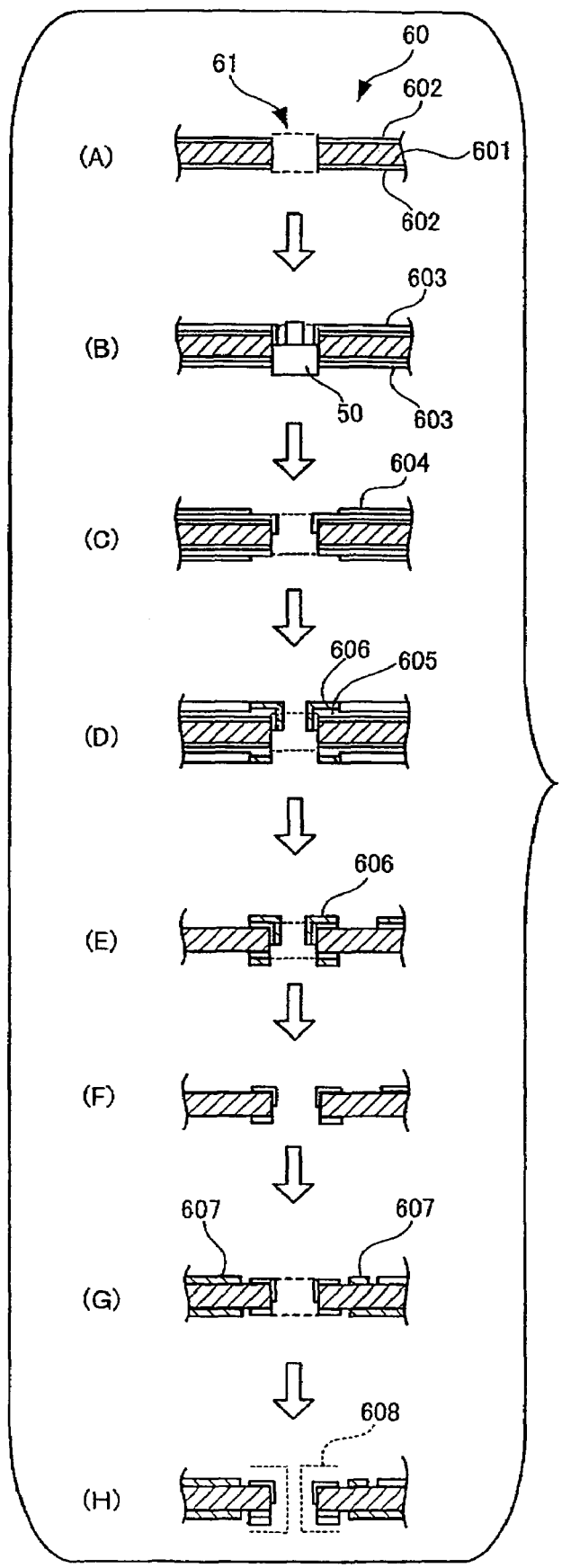
FIG. 9 shows a second example of the printed circuit board manufacturing method.

FIG. 9 shows a second example of the printed circuit board manufacturing method.

The steps in parts (A) to (E) in FIG. 9 are identical to those in parts (A) to (E) in FIG. 8 and, thus redundant description thereof will be omitted.

In part (F) of FIG. 9, an avulsion treatment is performed on the surface of the solder layer 606.

The steps in parts (F) to (H) of FIG. 9 are identical to those in parts (F) to (G) of FIG. 8.

In a case of the manufacturing method shown in FIG. 9, in comparison with the manufacturing method shown in FIG. 8, since the avulsion treatment to the solder layer 606 is added as shown in part (F) of FIG. 9, there can be formed a wire finer than 130 micro meters in width of the wire which is a limit in the manufacturing method of FIG. 8.

Figure 10:
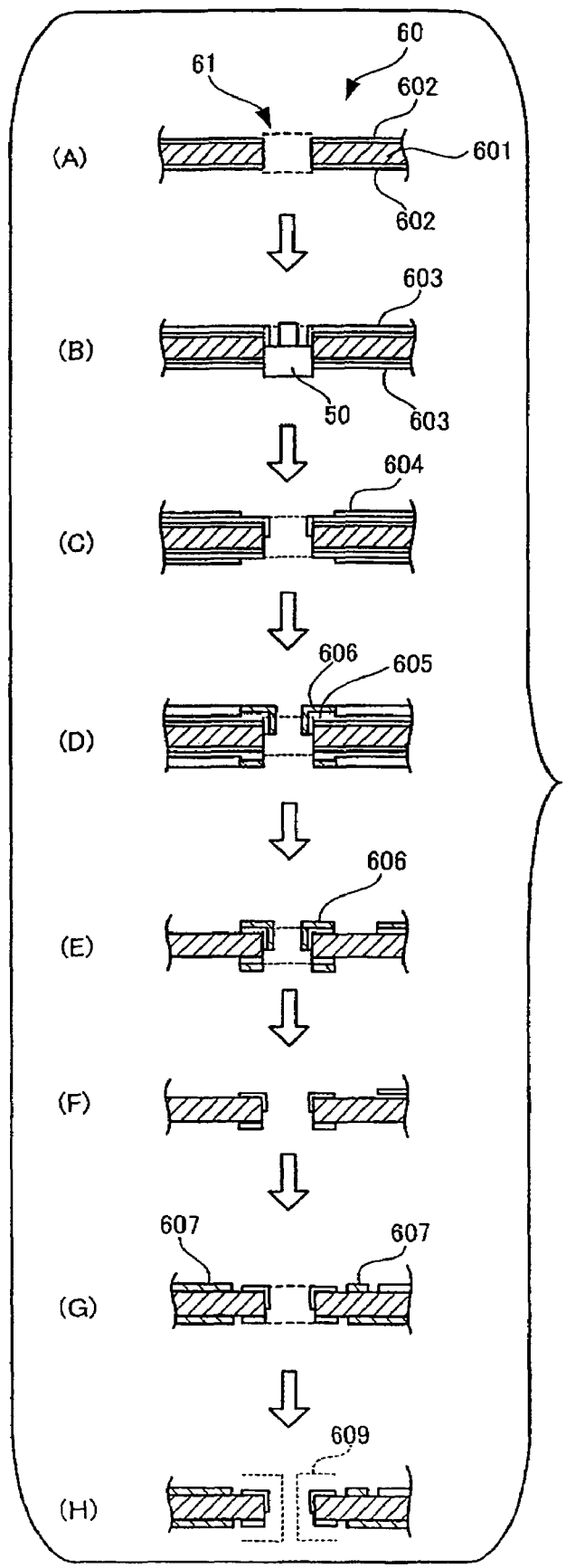
FIG. 10 shows a third example of the printed circuit board manufacturing method.

FIG. 10 shows a third example of the printed circuit board manufacturing method.

The steps in parts (A) to (G) in FIG. 10 are identical to those in parts (A) to (G) in FIG. 9 and thus, redundant description thereof will be omitted.

In part (H) of FIG. 10, a solder layer 609 is formed by solder spray in place of the anti tarnish treatment in parts (G) and (H) of FIG. 9.

Figure 11:
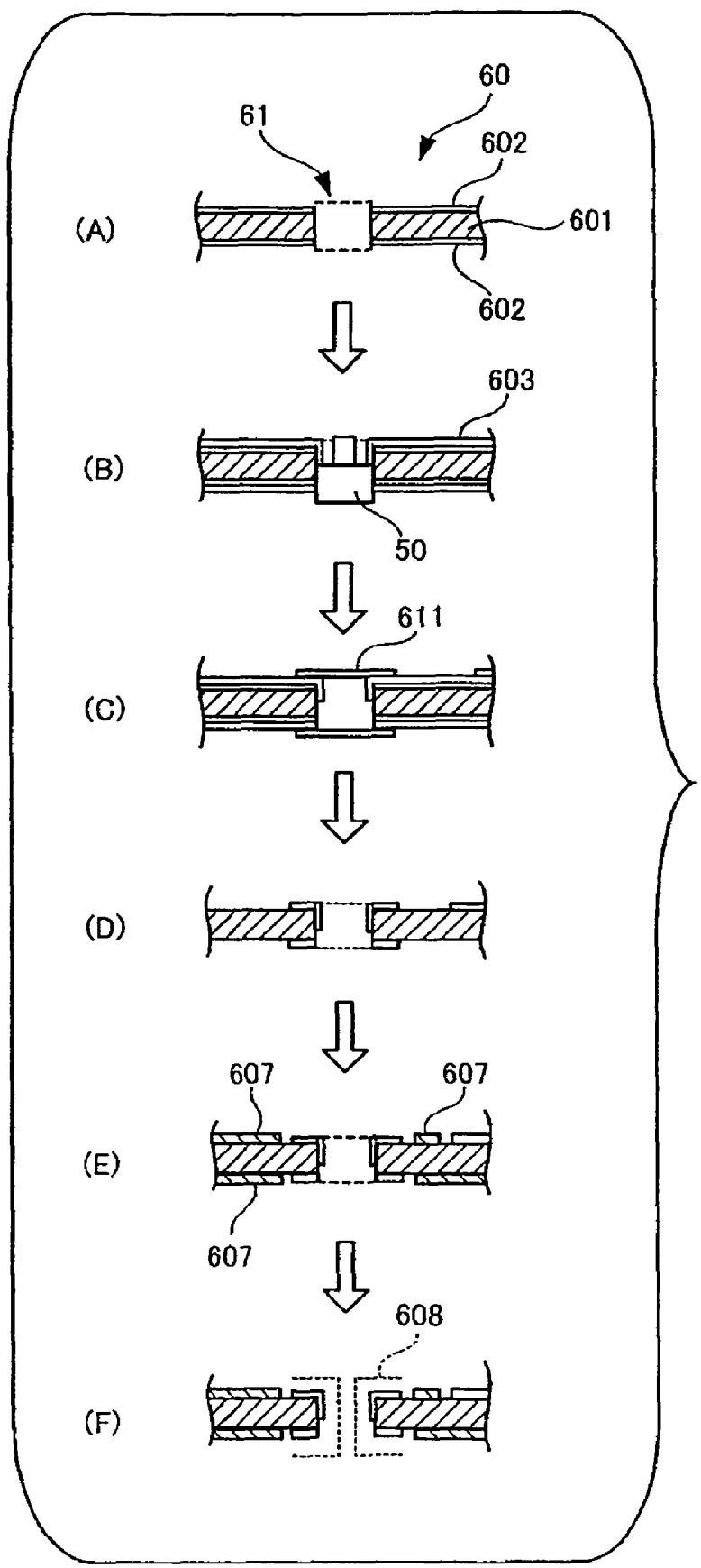
FIG. 11 shows a fourth example of the printed circuit board manufacturing method.

FIG. 11 shows a fourth example of the printed circuit board manufacturing method.

In parts (A) and (B) of FIG. 11, in the same manner as parts (A) and (B) of FIG. 8, a substrate 60 obtained by forming a copper layer 602 on the surface and the underside of the resin 601 is prepared, and the hole 61 is formed by applying a hole-forming treatment to the substrate 60, and a copper layer 603 is formed in a state in which the jig 50 is inserted into the hole 61 by plating.

Next, as shown in part (C) of FIG. 11, an etching resist film 611 is formed by dry-film lithography and developing, and as shown in part (D) of FIG. 11, the copper layer in regions not covered by the etching resist film 611 is removed by etching, and then the etching resist film 611 is also removed. After that, in the same manner as in parts (F) and (G) of FIG. 8, the resist film 607 is formed (part (E) of FIG. 11), and an anti-tarnish treatment 608 is performed.

As shown in these FIG. 8 to FIG. 11, the present invention can be applied to a great many different kinds of printed circuit board manufacturing methods.

What is claimed is:

1. A printed circuit board manufacturing method comprising:

forming a through hole in a substrate;

inserting a hollow jig in the through hole such that the hollow jig adheres to a first portion in a direction in which the through hole penetrates, of an inner wall of the through hole, the inner wall including a second portion connecting to the outside of the through hole; wherein the first portion of the inner wall and the second portion of the inner wall are arranged adjacent to each other in the direction in which the through hole penetrates the substrate; and forming a conductive film on the second portion of the inner wall, after the hollow jig is inserted into the through hole.

2. The printed circuit board manufacturing method according to claim 1, wherein the conductive film is formed by plating an outer face of the substrate and the second portion of the inner wall.

* * * * *